US006683486B2

(12) United States Patent
Hanson et al.

(10) Patent No.: US 6,683,486 B2
(45) Date of Patent: Jan. 27, 2004

(54) LOW VOLTAGE SHIFTER WITH LATCHING FUNCTION

(75) Inventors: David Hanson, Brewster, NY (US); Gerhard Mueller, Meitingen (DE); Toshiaki Kirihata, Poughkeepsie, NY (US)

(73) Assignees: Infineon Technologies Ag, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/114,221

(22) Filed: Apr. 2, 2002

(65) Prior Publication Data

US 2003/0184358 A1 Oct. 2, 2003

(51) Int. Cl.[7] .................................................. H03L 5/00
(52) U.S. Cl. ...................................................... 327/333
(58) Field of Search ............................ 327/333; 326/80, 326/81

(56) References Cited

U.S. PATENT DOCUMENTS

| 5,510,731 | A | * | 4/1996 | Dingwall | 327/333 |
| 5,825,205 | A | * | 10/1998 | Ohtsuka | 326/81 |
| 6,011,421 | A | * | 1/2000 | Jung | 327/333 |
| 6,094,083 | A | * | 7/2000 | Noda | 327/333 |
| 6,445,226 | B2 | * | 9/2002 | Taniguchi | 327/333 |

* cited by examiner

Primary Examiner—My-Trang Nu Ton
(74) Attorney, Agent, or Firm—Slater & Matsil, L.L.P.

(57) ABSTRACT

A low voltage level shifter circuit with an embedded latch, implemented on a signal line having thereon low voltage signals. There is included a low voltage level shifter circuit configured to receive a low voltage input signal from a first portion of the signal line and output a higher voltage output signal on a second portion of the signal line. A latching circuit is also included, and is configured to latch the low voltage input signal from the first portion of the signal line.

21 Claims, 7 Drawing Sheets

US 6,683,486 B2

LOW VOLTAGE SHIFTER WITH LATCHING FUNCTION

FIELD OF THE INVENTION

This invention relates to semiconductor devices, and more particularly, to a low voltage level shifter circuit.

BACKGROUND OF THE INVENTION

There is a constant motivation to reduce power consumption for integrated circuits due to packaging requirements, as well as for portable applications. One approach is to use low voltage signaling for buses whenever possible.

Low voltage signaling is attractive to designers since it dramatically reduces the power consumption requirements and leads to decreased electromigration in the conductors of the integrated circuit. With reduced electromigration, the chances of developing voids and shorts in the conductors are greatly reduced. Furthermore, lower power consumption also leads to decreased electrical noise, as less charge is dumped on the ground and power buses at any given time.

FIG. 1 depicts a conventional low voltage buffer and latch 100. The circuit comprises an input buffer stage 110 coupled to a latch stage 112. Low voltage input at input port QRWD may swing from 0V to 1V, which is lower than the full internal device voltage, $V_{DD}$. Output voltage at output port SRWD may range from 0V to 2V. When the enable signal, ENB, is active high, the circuit drives and latches the data at the input read-write data port, RWD. When ENB goes low, the circuit is disabled and the data at QRWD is latched.

To appreciate the problems encountered when low voltage signals are employed in an inverter-based voltage level shifter circuit, consider the situation when a logically low signal is presented at the input QRWD (e.g. around 0 V). In this case, not only will transistors 118 and 121 be turned on as expected, there will be leakage paths through transistors 126 and 128 of inverter 116 and transistors 130 and 132 of inverter 114.

The presence of leakage current significantly degrades the signal at the output and greatly increases power dissipation. As can be appreciated from the above discussion, it is desirable to provide a low voltage latch circuit that eliminates the current leakage problem.

SUMMARY OF THE INVENTION

The invention relates, in one embodiment, to a method for implementing a low voltage level shifter circuit with an embedded latch on a signal line having thereon low voltage signals. The low voltage signals have a voltage level that is below the full internal device voltage, $V_{dd}$.

The low voltage level shifter circuit is configured to latch the low voltage input signal and output a voltage signal with a voltage range that is higher than the voltage range associated with the low voltage input signal. The method includes coupling the input node to the first portion of the signal line. The input node is coupled to an input stage of the level shifter circuit. The input stage is configured to receive the low voltage signal on the signal line. The input stage is also coupled to a level shifting stage that is configured to output a set of level shifting stage control signals responsive to the low voltage input signal. The level shifter control signals are coupled to a latching stage, the latching stage being coupled to the input stage. The latching stage is arranged to latch the low voltage input signal received at the input stage. The method further includes coupling the output node to the level shifting stage. The output node is also coupled to the second portion of the signal line to output a higher voltage level signal.

In another embodiment, the invention relates to a method, for implementing a low voltage level shifter circuit with an embedded latch on a signal line having thereon low voltage signals. The method includes receiving the first low voltage signal using an input stage of the level shifter circuit, the input stage being coupled to the input node. In addition, the method includes forming, using a level shifting stage of the low voltage level shifter circuit, a set of control signals responsive to the low voltage input signal. The voltage range associated with the control signals is higher than the voltage range of the low voltage level input signal. Furthermore, there is included latching the low voltage input signal within a latching stage of the low voltage level shifter circuit. The method further includes outputting an output voltage signal from the level shifting stage control signals. The voltage range associated with the output signal is higher than the voltage range of the low voltage input signal.

In another embodiment, the invention relates to a method for implementing a low voltage repeater circuit with an embedded latch, configured to be coupled to a signal line having thereon low voltage signals. The low voltage levels have a voltage level below $V_{dd}$. The method includes coupling an input node to the first portion of the signal line to receive a first low voltage input signal. The input node is also coupled to an input stage of the repeater circuit, the input stage being configured to receive the first low voltage signal on the signal line. Furthermore, the input stage is coupled to a level shifting and latching stage that is arranged to latch the first low voltage input signal and output a set of level shifting stage control signals responsive to the first low voltage signal. The level shifting and latching stage boosts the output control signals, causing the voltage range associated with the set of level shifting stage control signals to be higher than the voltage range of the first low voltage signal. The method further includes coupling the level shifting and latching stage to the output stage of the repeater circuit. The output stage is configured to output a low voltage level signal and is coupled to an output node, which is coupled to the second portion of the signal line.

These and additional features of the present invention will be described in more detail in the following figures and detailed description of the invention.

BRIEF DESCRIPTION OF THE DRAWINGS

FIG. 4a demonstrates a repeater application of the low voltage level shifter configuration shown in FIG. 2a.

FIG. 4b shows the timing diagrams of the repeater circuit shown in FIG. 4a.

PREFERRED EMBODIMENTS OF THE INVENTION

Figure 1:
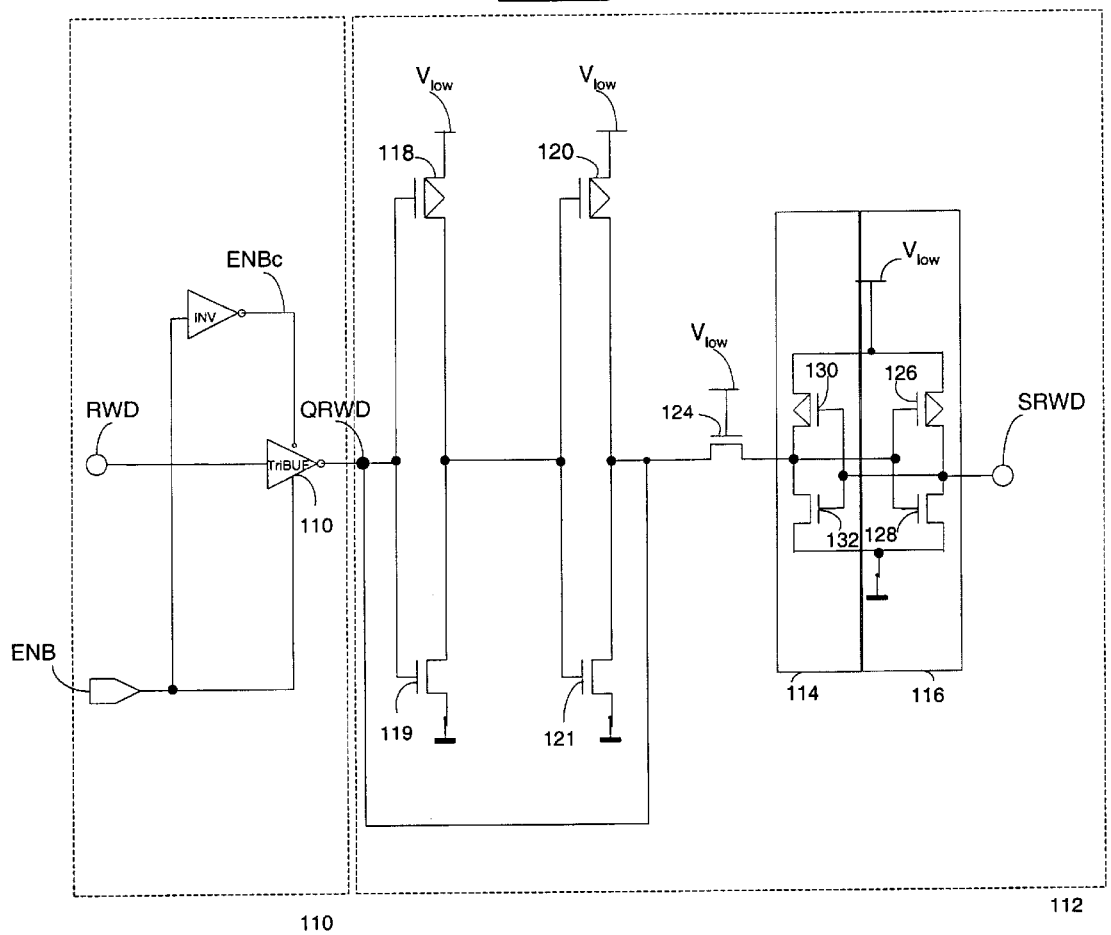
FIG. 1 illustrates a conventional low voltage latch and buffer circuit that may be found in a typical integrated circuit.

The present invention relates generally to improving the performance of low voltage integrated circuits. In particular, it relates to a low voltage level shifter that has the ability to latch low voltage data with reduced power dissipation. In accordance with one aspect of the present invention, various configurations are disclosed as being suitable candidates for shifting and latching low voltage data. In accordance with another aspect of the invention, the low voltage level shifter circuits are employed in repeater applications to latch and efficiently transmit low voltage level data, with reduced power dissipation, electrical noise and/or electromigration.

FIG. 2a illustrates, in accordance with one embodiment of the invention, a block diagram of a low voltage level shifter circuit 200. The circuit comprises of an input stage 210, a level shifting stage 220 and a latching stage 230. As shown, the input signal at QRWD is optionally coupled to input stage 210, passed to the level shifting stage 220, and then to the latching stage 230.

The level shifting stage 220 outputs a high voltage signal to node SRWD in response to a low voltage signal from the input stage. The low voltage signal has a voltage level that is below the full internal device voltage $V_{dd}$. The high voltage output signal has a voltage range of about $V_{dd}$, which is higher than the low voltage input range. The level shifting stage output control signal activates the latching stage 230. The latching stage 230 is configured to latch the low voltage input signal received at the input stage.

FIG. 2b illustrates, in greater detail and in accordance with one embodiment of the invention, a low voltage level shifter 200 with a latching function. The input stage comprises two field effect transistors (FETs) 212 and 214, connected in parallel, whose gates are connected to a power source with a voltage level that is at least a threshold voltage $V_{th}$ higher than the input voltage $V_{QRWD}$. This is done to ensure that the transistors are turned on to allow the input voltage signal to pass through to transistors 222 and 224 in the level shifting stage. Alternatively, the gate voltage of transistors 212 and 214 can be a signal having 2 logical states. When the signal is at logic level '0', the level shifter is disabled and tri-stated from signal QRWD. When the signal is at logic level '1', the level shifter is enabled and receives the signal QRWD.

Within the level shifting stage 220, low voltage input signals are shifted to a higher voltage range. Depending on the input signal received, the level shifting stage outputs either a logical low voltage (e.g. 0 V) or logical high voltage (e.g. 2 V), and transmits the output signal to the latching stage 230.

It should be noted that although FET 224 is represented as a low threshold n-type FET (the low threshold characteristic indicated by the circle surrounding the transistor symbol), such is not a requirement as long as the threshold voltage is lower than the upper power rail (e.g. 1 V) of the low voltage input at QRWD. Generally, low threshold FETs may have a threshold voltage of about 0.4 to 0.5 V, which is lower than typical FETs that may have a threshold voltage of 0.6 to 0.7 V.

The transistors in the latching stage 230 latch the input signal at the port QRWD, hence reducing standby current leakage and power dissipation. Accordingly, a low voltage level shifter circuit with the ability to latch low voltage data is formed.

To facilitate further understanding, the operation of the level shifter circuit will now be explained in detail. Consider the situation wherein a low input signal (e.g. 0 V) is applied at the global data port QRWD. The signal passes through transistors 212 and 214 in the input stage to transistors 222 and 224 in the level shifting stage. The n-type FET 224 is turned off, and the p-type FET 222 is turned on, thereby passing the signal to the latching stage 230.

The transistor 222 is operated with a power level $V_{dd}$, which represents the full internal voltage at which the circuit operates. $V_{dd}$ is higher than the low input voltage but may be equal or lower than the external voltage level supplied to the integrated circuit. Typically, the input voltage at QRWD has a range of 0 to 1 V, and $V_{dd}$ has a range of 0 to 2 V. Hence, the logical low input voltage is inverted and raised approximately to a high voltage level (e.g. 2 V) and passed to the latching stage.

Within the latching stage, p-type FET 232 is turned off by the high signal at node A, and n-type FETs 234 and 236 are turned on. Since FETs 234 and 236 are conducting, the voltage levels at nodes XRT and XRB are pulled down to logical low voltage level (e.g. 0V), therein latching the logical low input voltage transmitted from QRWD. As can be appreciated from the foregoing discussion, a logical low input signal at QRWD causes a shifted logical high $V_{dd}$ output to appear at the output port SRWD, and the logical low input signal at QRWD to be latched.

Consider the situation when a logical high input signal with a low voltage level (e.g. 1V) is applied at the QRWD port. The high signal turns on n-type FET 224 and turns off p-type FET 222 in the level shifting stage. Since transistor 224 is conducting, node A is pulled down to a logical low voltage level (e.g. 0 V).

Since node A is low, n-type FETs 234 and 236 are turned off, and p-type FET 238 is turned on, therein coupling the node XRB to a high $V_{dd}$ and latching the high voltage input signal at QRWD. FET 232 is connected between nodes A and XRT, to maintain FET 222 in its off state when the FET 238 is turned on by a logical low signal applied at node A.

Figure 3:
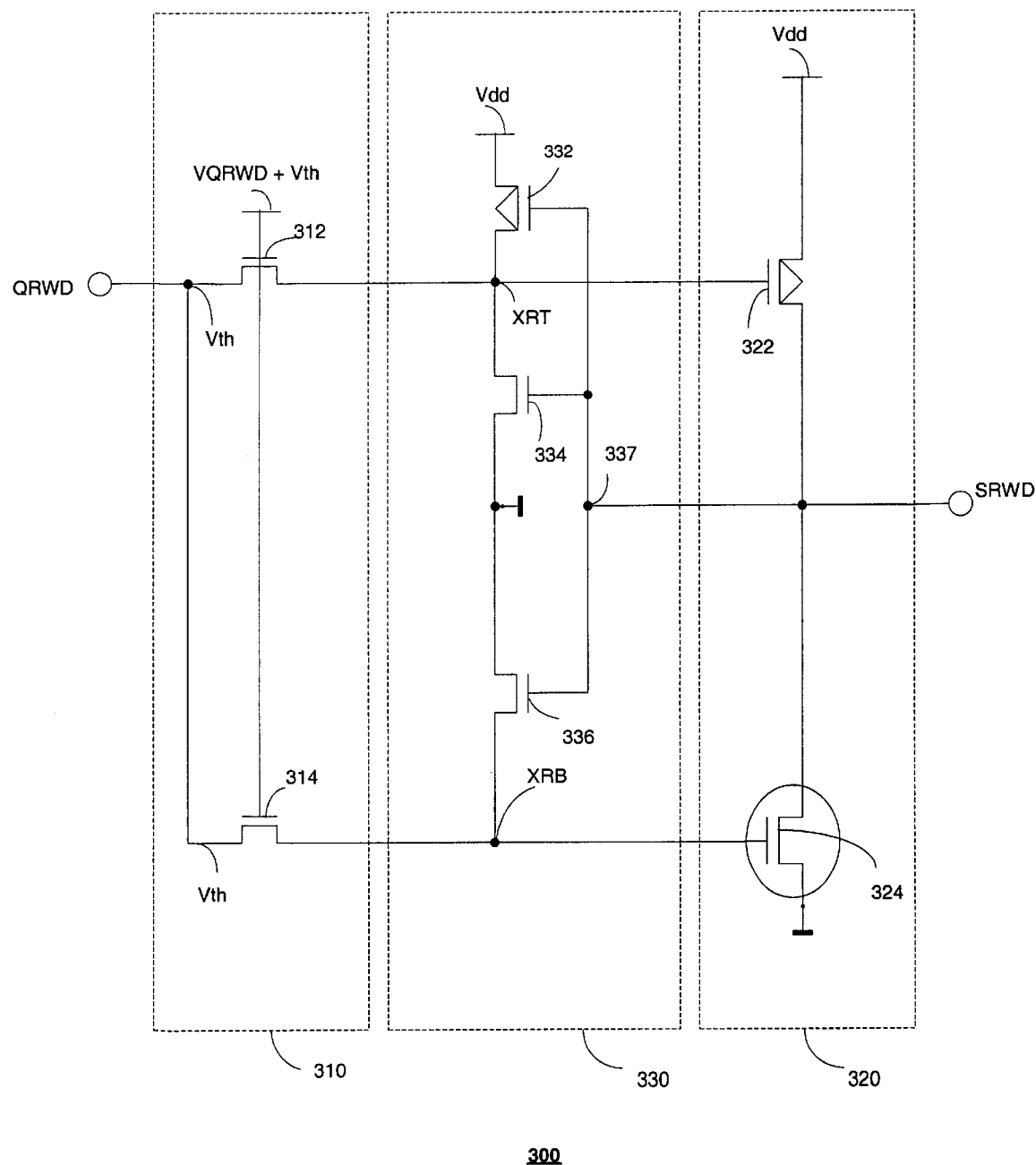
FIG. 3 shows an alternative embodiment of the invention.

Referring to FIG. 3, FET 238 is removed from the circuit 200, forming yet another embodiment of the invention 300. The circuit comprises of similar input stage 310, level shifting stage 320 and latching stage 330. As can be appreciated from the foregoing discussion, a logical high input signal (e.g. 1 V) at port QRWD will produce a logical low signal (e.g. 0 V) at the output port SRWD, with the input signal latched within the circuit.

Figure 4:
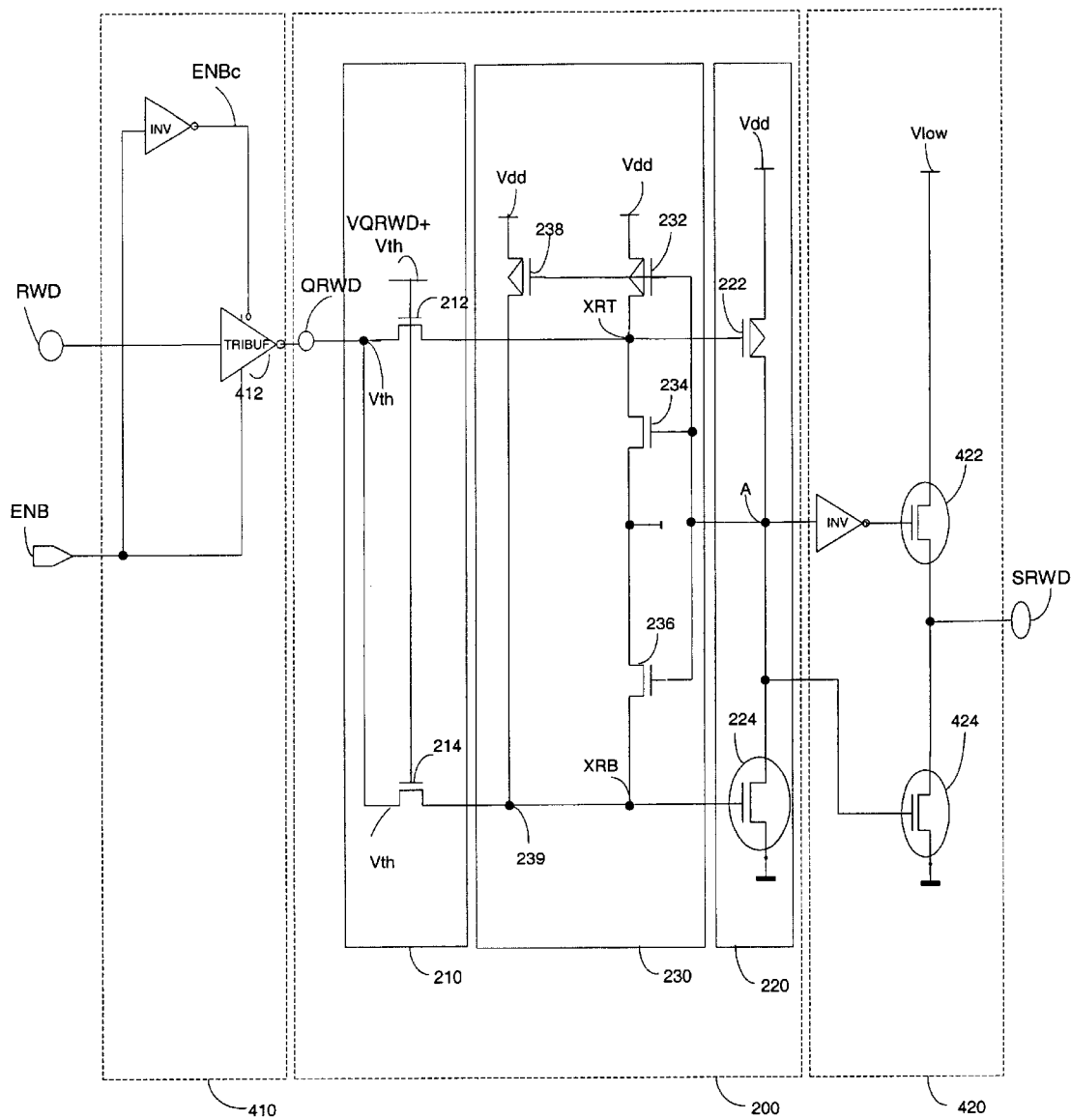
Figure 4:
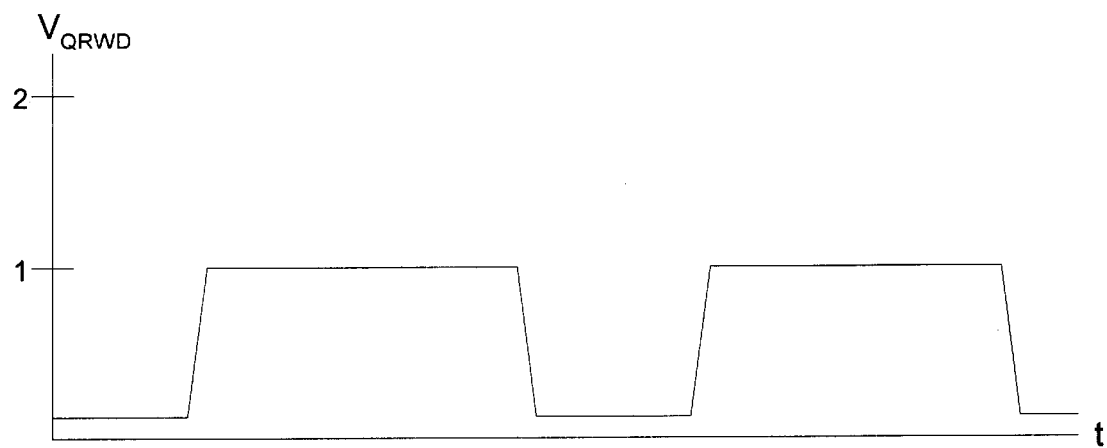
Figure 4:
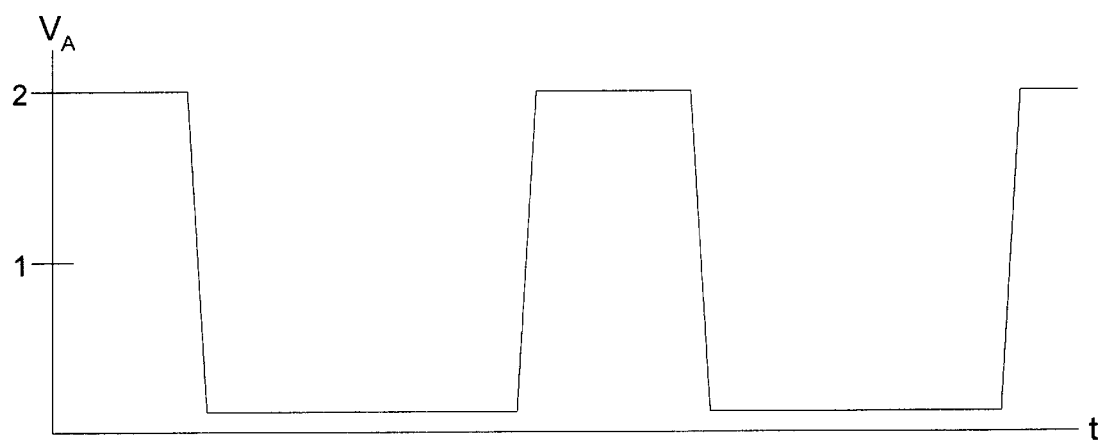
Figure 4:
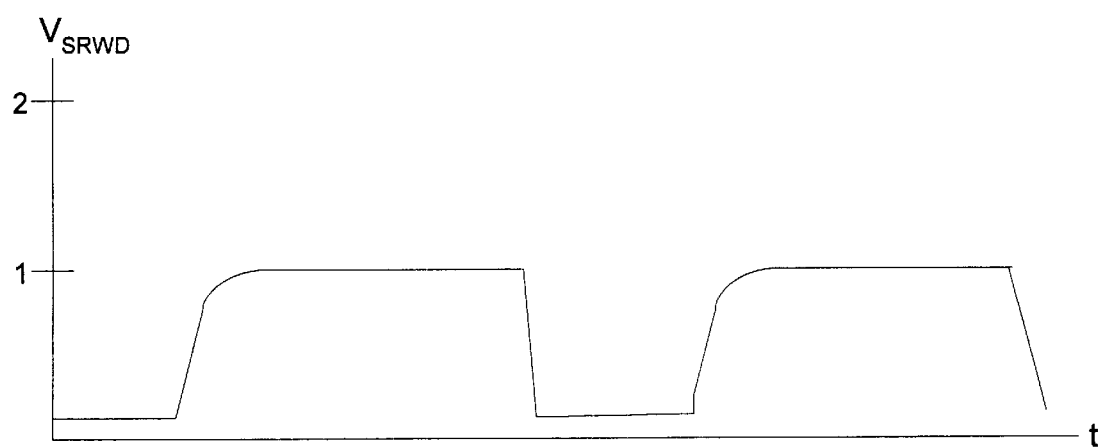

FIG. 4a illustrates, in accordance with one aspect of the present invention, a low voltage repeater circuit 400 which employs a low voltage level shifter with an embedded latch. The level shifter circuit latches the input signal and boosts the low voltage input signal into control signals having a greater voltage range to control the output transistors 422 and 424 in the output stage 420.

In one embodiment, the low voltage shifter with the embedded latch is implemented by the circuit 200 discussed in connection with FIG. 2a. The output of the tri-state buffer 412 in the input stage 410 is coupled to the input port QRWD of the level shifting and latching stage 200. Within the input stage 410, the tri-state buffer 412 is capable of receiving a low voltage signal at port RWD and is controlled by enable signal ENB and its complement ENBc. The buffer enable signal ENB and its complement ENBc are optional and may be tied high and low respectively without affecting the functionality of the circuit. It should be noted that although FETs 422 and 424 are represented in the drawing as low threshold n-FETs, such is not a requirement as long as the threshold voltage of these transistors is lower than the upper power rail of the low voltage input at RWD.

In operation, when the control signal ENB is high, the tri-state buffer 412 passes a low voltage signal at port RWD to port QRWD of the level shifting and latching stage 200.

Figure 2:
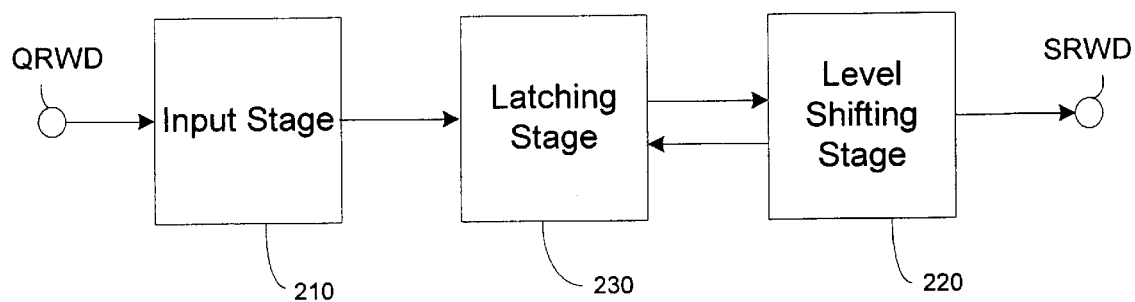
FIG. 2a shows, according to one embodiment of the present invention, a simplified low voltage level shifter circuit with a latching function.
FIG. 2b shows, according to one embodiment of the present invention and in greater detail, a low voltage level shifter circuit with a latching function.
Figure 2:
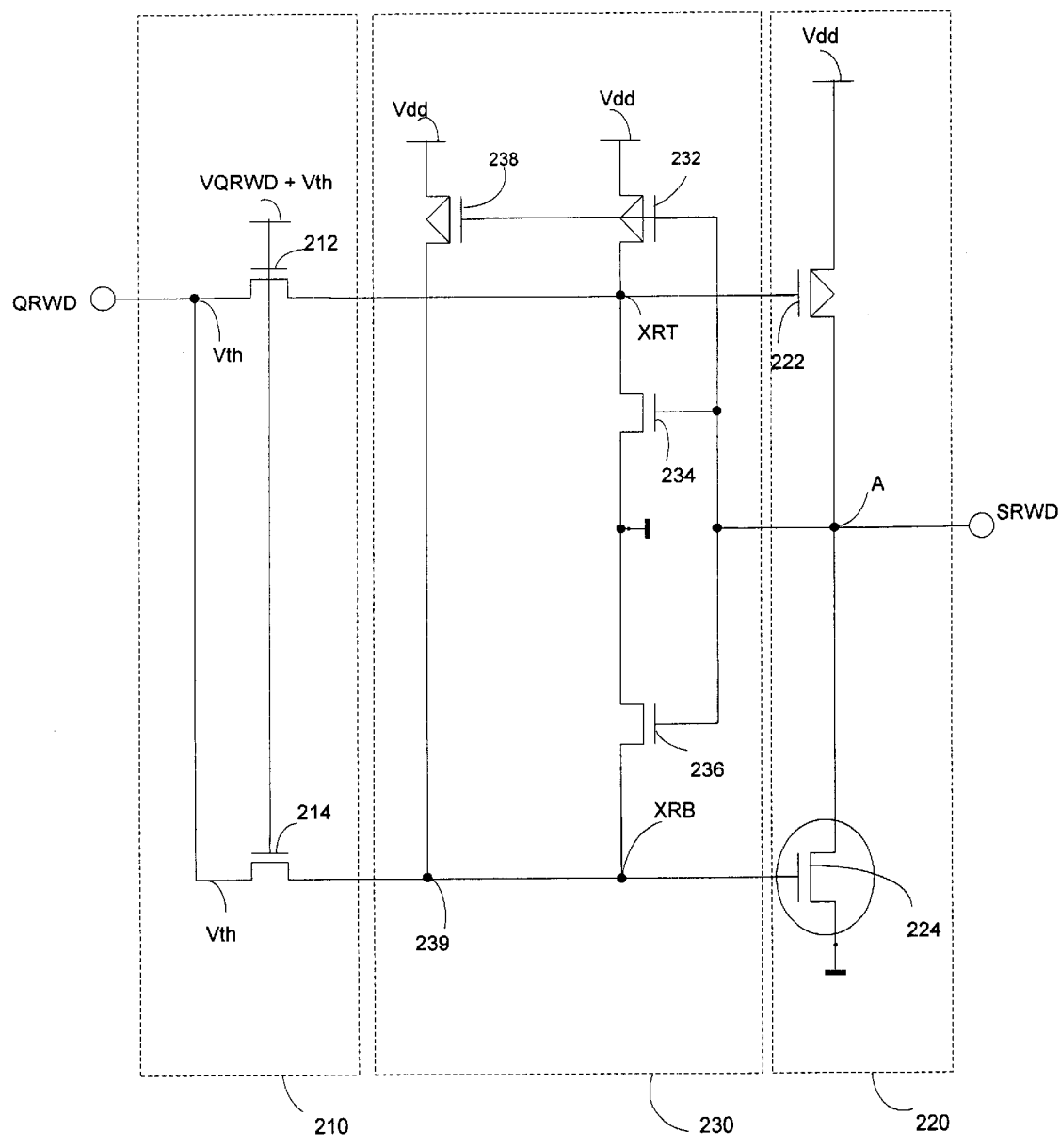

When the enable signal ENB is low, the tri-state buffer 412 is deactivated and the low voltage data at port QRWD is latched. Reference may be made back to FIG. 2 for specific details pertaining to the operation of the level shifting and latching circuit 200 in response to the input voltage signal at QRWD.

Consider the situation when the tri-state buffer 412 is activated and a logical low signal (e.g. 0 V) is applied at the input port RWD. The input signal at QRWD is latched and output node A will be at a high voltage level of about $V_{dd}$ (e.g. 2 V). At the same time, within the output stage 420, FET 422 is turned off and FET 424 is turned on, coupling SRWD to ground potential (e.g. 0 V). When a logical high signal (e.g. 1 V) is applied at the input port RWD, the circuit 200 latches the signal and outputs a low signal of about 0 V at node A, which turns FET 424 off and FET 422 on, therein coupling the output port SRWD to a low voltage source Vlow (e.g. 1 V).

To facilitate further understanding of the repeater circuit 400, timing diagrams of the signals at repeater input node QRWD ($V_{QRWD}$), level shifting and latching circuit output node A ($V_A$) and repeater output node SRWD ($V_{SRWD}$) are shown in FIG. 4b. When the low voltage input at QRWD goes high, the signal at node A goes low and the output signal at node SRWD is raised to a low voltage logical high signal of about 1V. A logical low signal at the input node QRWD will cause a high voltage of about 2V at node A and a logical low signal at the output node SRWD. Accordingly, the circuit depicted in FIG. 4a functions as a repeater which latches and passes a low voltage signal at port RWD to port SRWD. In general, the enable signal ENB is preferably valid before the data arrives at the repeater input port RWD to prevent signal transmission delay.

Figure 5:
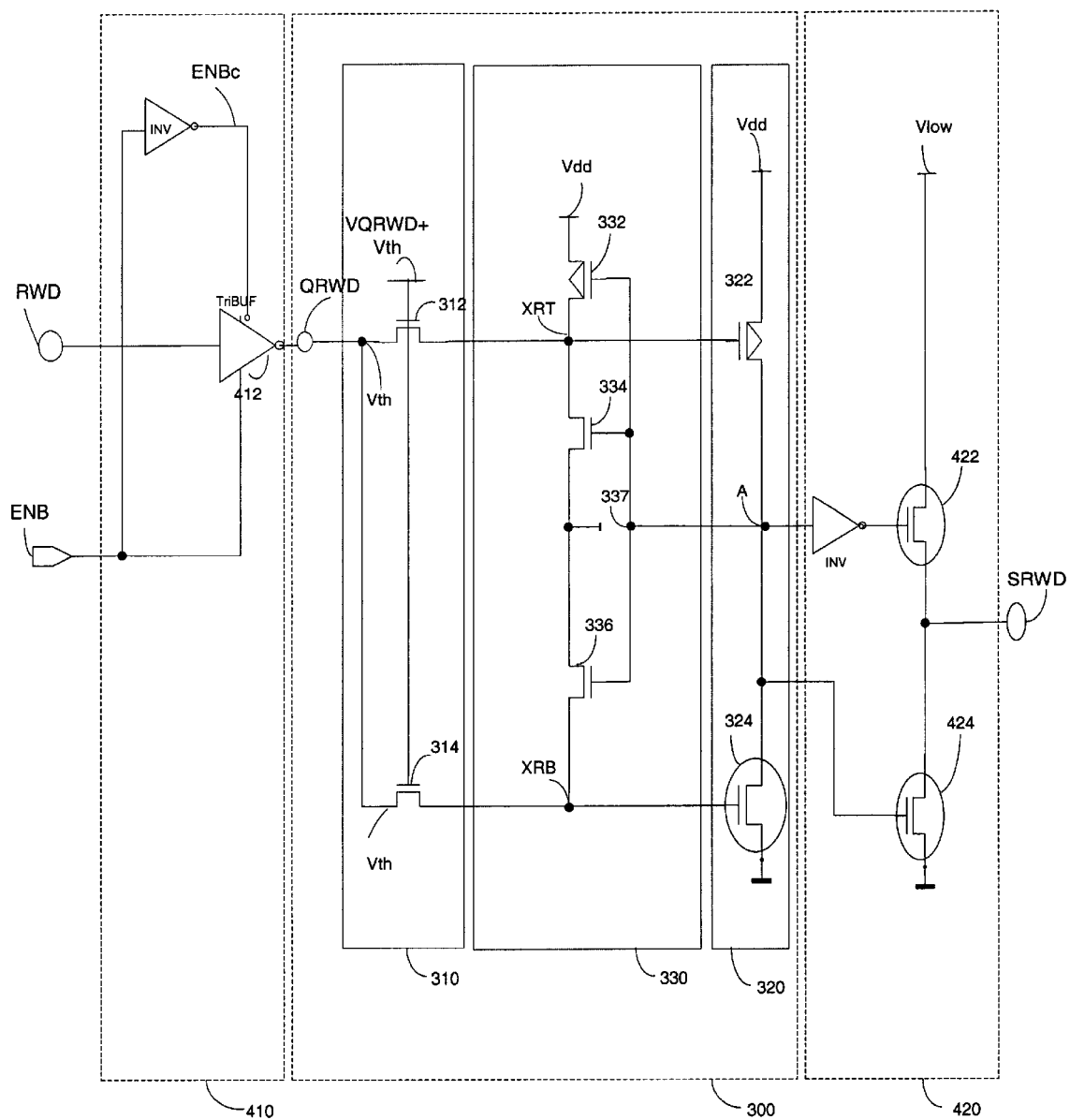
FIG. 5 depicts, according to an alternative embodiment of the invention, a repeater application of the low voltage level shifter configuration shown in FIG. 3.

FIG. 5 illustrates an alternative embodiment of the present invention, showing an exemplary configuration of a repeater application employing the low voltage level shifter circuit 300 with an embedded latch shown in FIG. 3.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A low voltage level shifter circuit having a latching function implemented on a signal line of an integrated circuit comprising:
    an input terminal for receiving an input signal having a first voltage range, the first voltage range being from a first low to a first high voltage level, the first high voltage level is less than a full internal device voltage ($V_{CC}$);
    a level shifter stage, the level shifter stage being configured to receive the input signal and output a level shifter stage output signal, the level shifter output signal having a second voltage range, the second voltage range being from a second low to a second high voltage level, the second high voltage level is equal to out $V_{CC}$;
    a latching circuit coupled to the level shifter stage, the latching circuit being configured to latch the input signal; and
    an output stage for receiving that level shifter stage output signal and generating an output signal at an output terminal, the output signal having the first voltage range.

2. The low voltage level shifter circuit of claim 1 further including an input stage coupled between the input terminal and the level shifter stage and the latching circuit to pass the input signal from the input terminal to the level shifter stage.

3. The low voltage level shifter circuit of claim 2 wherein the input stage comprises:
    a first n-type FET having a first n-type FET gate, a first n-type FET drain and a first n-type FET source, the first n-type FET gate being coupled to a voltage source, the voltage source having a voltage level higher than the threshold voltage of the first retype FET to ensure the first n-type FET is turned on when the level shifter circuit is enabled, one of the first n-type FET drain and the first n-type FET source being coupled to the input terminal to receive the input signal, another one of the first n-type FET drain and the first n-type FET source being coupled to a first node; and
    a second n-type FET having a second n-type FET gate, a second n-type FET drain and a second n-type FET source, the second n-type FET gate being coupled to a voltage source, the voltage source having a voltage level higher than the threshold voltage of the second n-type FET to ensure the second n-type FET is turned on when the level shifter circuit is enabled, one of the second n-type FET drain and the second n-type FET source being coupled to the input terminal to receive the input signal, another one of the first n-type FET drain and the first n-type FET source being coupled to a second node.

4. The low voltage level shifter circuit of claim 3 wherein the level shifter stage comprises:
    a first P-type FET having a first p-type FET gate, a first p-type FET drain and a first p-type FET source, the first p-type FET gate being coupled to the first node, one of the first p-type FET drain and the first p-type FET source being coupled to a full internal device voltage source, another one of the first p-type FET drain and the first p-type FET source being coupled to a third node, the third node being coupled to the output terminal; and
    a third n-type FET having a third n-type FET gate, a third n-type FET drain and a third n-type FET source, the third n-type FET gate being coupled to the second node, one of the third n-type FET drain and the third n-type FET source being coupled to the third node, another one of the third n-type FET drain and the th n-type FET source being coupled to ground.

5. The low voltage level shifter circuit of claim 4 wherein the latching circuit comprises:
    a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node;
    a third p-type FET having a third p-type FET gate, a third p-type FET drain and a third p-type FET source, the third p-type FET gate being coupled to the third node, one of the third p-type FET drain and the third FET source being coupled to a full internal device voltage source, another one of the third p-type FET drain and the third p-type FET source being coupled to the second node;
    a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fourth n-type FET drain and the fourth n-type FET source being coupled to ground; and a fifth n-type FET having a fifth n-type FET gate, a fifth n-type FET drain and a fifth n-type FET source, the filth n-type FET gate being coupled to the third node, one of the fifth n-type FET drain and the fifth n-type FET source being coupled to ground, another one of the fifth n-type FET drain and the fifth n-type FET source being coupled to the second node.

6. The low voltage level shifter circuit of claim 4 wherein the latching circuit comprises:

a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node;

a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fourth n-type FET drain and the fourth n-type FET source being coupled to ground; and a fifth n-type FET having a fifth n-type FET gate, a fifth n-type FET drain and a fifth n-type FET source, the filth n-type FET gate being coupled to the third node, one of the fifth n-type FET drain and the fifth n-type FET source being coupled to ground, another one of the fifth n-type FET drain and the fifth n-type FET source being coupled to the second node.

7. A low voltage level shifter circuit having a latching function implemented on a signal line of an integrated circuit comprising:

a level shifter circuit, the level shifter circuit being configured to receive a low voltage input signal from a first portion of the signal line and output a higher voltage output signal on a second portion of the signal line, the low voltage input signal having a voltage level lower than a full internal device voltage, and the higher voltage output signal having a voltage range which is higher than the voltage range associated with the low voltage input signal, wherein the level shifter circuit comprises, a first p-type FET having a first p-type FET gate, a first p-type FET drain and a first p-type FET source, the first p-type FET gate being coupled to a first node, one of the first p-type FET drain and the first p-type FET source being coupled to a full internal device voltage source, another one of the first p-type FET drain and the first p-type FET source being coupled to a third node, the third node being coupled to the second portion of the signal line, and a third n-type FET having a third n-type FET gate, a third n-type FET drain and a third n-type FET source, the third n-type FET gate being coupled to a second node, one of the third n-type FET drain and the third n-type FET source being coupled to the third node, another one of the third n-type FET drain and the third n-type FET source being coupled to ground;

a latching circuit coupled to the level shifter circuit, the latching circuit being configured to latch the low voltage input signal from the first portion of the signal line, wherein the latching circuit comprises, a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node, a third p-type FET having a third p-type FET gate, a third p-type FET drain and a third p-type FET source, the third p-type FET gate being coupled to the third node, one of the third p-type FET drain and the third p-type FET source being coupled to a full internal device voltage source, another one of the third p-type FET drain and the third p-type FET source being coupled to the second node, a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fourth n-type FET drain and the fourth n-type FET source being coupled to ground, and a fifth n-type FET having a fifth n-type FET gate, a fifth n-type FET drain and a fifth n-type FET source, the fifth n-type FET gate being coupled to the third node, one of the fifth n-type FET drain and the fifth n-type FET source being coupled to ground, another one of the fifth n-type FET drain and the fifth n-type FET source being coupled to the second node; and an input stage coupled between the first portion of the signal line and the level shifter circuit and the latching circuit to pass the low voltage signal from the first portion of the signal line to the level shifter circuit.

8. A low voltage level shifter circuit having a latching function implemented on a signal line of an integrated circuit comprising:

a level shifter circuit, the level shifter circuit being configured to receive a low voltage input signal from a first portion of the signal line and output a higher voltage output signal on a second portion of the signal line, the low voltage input signal having a voltage level lower than a full internal device voltage, and the higher voltage output signal having a voltage range which is higher than the voltage range associated with the low voltage input signal, wherein the level shifter circuit comprises, a first p-type FET having a first p-type FET gate, a first p-type FET drain and a first p-type FET source, the first p-type FET gate being coupled to a first node, one of the first p-type FET drain and the first p-type FET source being coupled to a full internal device voltage source, another one of the first p-type FET drain and the first p-type FET source being coupled to a third node, the third node being coupled to the second portion of the signal line, and a third n-type FET having a third n-type FET gate, a third n-type FET drain and a third n-type FET source, the third n-type FET gate being coupled to a second node, one of the third n-type FET drain and the third n-type FET source being coupled to the third node, another one of the third n-type FET, drain and the third n-type FET source being coupled to ground;

a latching circuit coupled to the level shifter circuit, the latching circuit being configured to latch the low voltage input signal from the first portion of the signal line, wherein the latching circuit comprises, a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node, a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fourth n-type FET drain and the fourth n-type FET source being coupled to ground, and a fifth n-type FET having a fifth n-type FET gate, a fifth n-type FET drain and a fifth n-type FET source, the fifth n-type FET gate being coupled to the third node, one of the fifth n-type FET drain and the fifth n-type FET source being coupled to ground, another one of the fifth n-type FET drain and the fifth n-type FET source being coupled to the second node; and an input stage coupled between the first portion of the signal line and the level shifter circuit and the latching circuit to pass the low voltage signal from the first portion of the signal line to the level shifter circuit.

9. A method for implementing a low voltage level shifter circuit with a latching function, comprising:

coupling an input terminal to an input stage of a level shifter circuit, the input terminal receive an input signal having a first voltage range, the first voltage range being from a first low to a first high voltage level, the first high voltage is less than a full internal device voltage;

coupling the input stage to a level shifting stage that is arranged to output a set of level shifting stage control signals responsive to the input signal, the set of level shifting stage control signals having a second voltage ranges, the second voltage range being from a second low to a second high voltage level, the second high voltage level being equal to about the full internal device voltage;

coupling the level shifting stage control signals to a latching stage, the latching stage also being coupled to the input stage, the latching stage being configured to latch the input signal; and coupling the an output node stage to the second the level shifting stage, the output stage outputting an output signal at an output terminal having the first voltage range.

10. A method implementing a low voltage level shifter circuit having a latching function, comprising:

providing an input signal at an input terminal of the low voltage level shifter circuit, the input signal having a first voltage range between first low and first high voltage levels, wherein the first high voltage level is less than full internal device voltage;

level shifting the input signal to a second voltage range, the second voltage range between second low and second high voltage levels, the second high voltage level being equal to about the full internal device voltage level;

latching the input signal; and outputting, an output signal, the output signal having the first voltage range.

11. A low voltage repeater circuit with a latching function, comprising:

an enable node for providing an enable signal; and a low voltage repeater circuit coupled between an input terminal and an output terminal, the low voltage repeater circuit being configured to latch and transmit an input signal from the input terminal to the output terminal when the enable signal is activated, wherein the input signal and output signals comprise a first voltage range, the first voltage range being from a first low to a first high voltage level, the first high voltage level being less than a full internal device voltage ($V_{CC}$), the low voltage repeater circuit comprises a level shifter stage for converting the input signal to a second voltage range from a second low to a second high voltage level, the second high voltage level being equal to about $V_{CC}$.

12. The low voltage repeater circuit of claim 11 further including a repeater input stage coupled between the input terminal and the low voltage repeater circuit to pass the input signal from the input terminal to the low voltage repeater circuit.

13. The low voltage repeater circuit of claim 12 wherein the repeater circuit conmprises a latching circuit coupled to a level shifter stage, the latching circuit being configured to latch the input signal from the repeater input stage.

14. The low voltage repeater circuit of claim 13 wherein the level shifter stage further includes a level shifter input stage coupled between the input terminal and the level shifter stage and the latching circuit to pass the input signal from the repeater input stage to the level shifter stage.

15. The low voltage repeater circuit of claim 14 wherein the level shifter input stage comprises:

a first n-type FET having a first n-type FET gate, a first n-type FET drain and a first n-type FET source, the first n-type FET gate being coupled to a voltage source, the voltage source having a voltage level higher than the threshold voltage of the first n-type FET to ensure the first n-type FET is turned on when the low voltage repeater circuit is enabled, one of the first n-type FET drain and the first n-type FET source being coupled to the repeater input stage to receive the input signal passed from the input terminal, another one of the first n-type FET drain add the first n-type FET source being coupled to first node; and a second n-type FET having a second n-type FET gate, a second n-type FET drain and a second n-type FET source, the second n-type FET gate being coupled to a voltage source, the voltage source having a voltage level higher than the threshold voltage of the second n-type FET to ensure the second n-type FET is turned on when the low voltage repeater circuit is enabled, one of the second n-type FET drain and the second n-type FET source being coupled to the input terminal to receive the input signal, another one of the first n-type FET drain and the first n-type FET source being coupled to a second node.

16. The low voltage repeater circuit of claim 15 wherein the level shifter stage comprises:

a first p-type FET having a first p-type FET gate, a first p-type FET drain and a first p-type FET source, the first p-type FET gate being coupled to the first node, one of the first p-type FET drain and the fast p-type FET source being coupled to a full internal device voltage source, another one of the first p-type FET drain and the first p-type FET source being coupled to a third node, the third node being coupled to the output terminal; and a third n-type FET having a third n-type FET gate, a third n-type FET drain and a third n-type FET source, the third n-type FET gate being coupled to the second node, one of the third n-type FET drain and the third n-type FET source being coupled to the third node, another one of the third n-type FET drain and the third n-type FET source being coupled to ground.

17. The low voltage repeater circuit of claim 16 wherein the latching circuit comprises:

a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node;

a third p-type FET having a third p-type FET gate, a third p-type FET drain and a third p-type FET source, the third p-type FET gate being coupled to the third node, one of the third p-type FET drain and the third p-type FET source being coupled to a full internal device voltage source, another one of the third p-type FET drain and the third p-type FET source being coupled to the second node;

a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fourth n-type FET drain and the fourth n-type FET source being coupled to ground; and a fifth n-type FET having a fifth n-type FET gate, a fifth n-type FET drain and a fifth n-type FET source, the fifth n-type FET gate being coupled to the third node, one of the fifth n-type FET drain and the fifth n-type FET source being coupled to ground, another one of the fifth n-type FET drain and the fifth n-type FET source being coupled to the second node.

18. The low voltage repeater circuit of claim 16 wherein the latching circuit comprises:

a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node;

a fourth n-type FET having a fourth n-type FET gate, a fourth n-type FET drain and a fourth n-type FET source, the fourth n-type FET gate being coupled to the third node, one of the fourth n-type FET drain and the forth n-type FET source being coupled to the first node, another one of the fourth n-type FET drain and the fourth n-type FET source being coupled to ground; and a fifth n-type FET having a fifth n-type FET gate, a fifth n-type FET drain and a fifth n-type FET source, the fifth n-type FET gate being coupled to the third node, one of the fifth n-type FET drain and the fifth n-type FET source being coupled to ground, another one of the fifth n-type FET drain and the fifth n-type FET source being coupled to the second node.

19. A low voltage repeater circuit with a latching function implemented on a signal line of an integrated circuit comprising:

an enable node for providing an enable signal;

a low voltage eater circuit coupled between a first portion of the signal line and a second portion of the signal line, being configured to transmit and latch low voltage signals from the first portion of the signal line to the second portion of the signal line when the enable signal is activated, wherein the voltage range associated with the low voltage signals is lower than a full internal device voltage;

a repeater input stage coupled between the first portion of the signal line and the low voltage repeater circuit to pass the low voltage signal from the first portion of the signal line to the low voltage repeater circuit;

a low voltage level shifter circuit the level shifter circuit being configured to receive the low voltage signal from the repeater input stage and output a higher voltage output signal on the second portion of the signal line, the higher voltage output signal having a voltage range which is higher than the voltage range associated with the low voltage signal, wherein the level shifter circuit comprises, a first p-type FET having a first p-type FET gate, a first p-type FET drain and a first p-type FET source, the first p-type FET gate being coupled to a first node, one of the first p-type FET drain and the first p-type FET source being couples to a full internal device voltage source, another one of the first p-type FET drain and the first p-type FET source being coupled to a third node, the third node being coupled to the second portion of the signal line, and a third n-type FET having a third n-type FET gate, a third n-type FET drain and a third n-type FET source, the third n-type FET gate being coupled to a second node, one of the third n-type FET drain and the third n-type FET source being coupled to the third node, another one of the third n-type FET drain and the third n-type FET source being coupled to ground;

a level shifter input stage coupled between the first portion of the signal line and the level shifter circuit and the latching circuit to pass the low voltage signal from the repeater input stage to the level shifter circuit, wherein the level shifter input stage comprises a first n-type FET having a first n-type FET gate, a first n-type FET drain and a first n-type FET source, the first n-type FET gate being coupled to a voltage source, the voltage source having a voltage level higher than the threshold voltage of the first n-type FET to insure the first n-type FET is turned on when the level shifter circuit is enabled, one of the first n-type FET drain and the first n-type FET source being coupled to the repeater input stage to receive the low voltage signal passed from the first portion of the signal line, another one of the first n-type FET drain and the first n-type FET source being coupled to the first node, and a second n-type FET having a second n-type FET gate, a second n-type FET drain and a second n-type FET source, the second n-type FET gate being coupled to a voltage source, the voltage source having a voltage level higher than the threshold voltage of the second n-type FET to ensure the second n-type FET is turned on when the level shifter circuit is enabled, one of the second n-type FET drain and the second n-type FET source being coupled to the first portion of the signal line to receive the low voltage signal, another one of the first n-type FET drain and the first n-type FET source being coupled to the second node; and a latching circuit coupled to the level shifter circuit, the latching circuit being configured to latch the low voltage input signal from the repeater input stage, wherein the latching circuit comprises, a second p-type FET having a second p-type FET gate, a second p-type FET drain and a second p-type FET source, the second p-type FET gate being coupled to the third node, one of the second p-type FET drain and the second p-type FET source being coupled to a full internal device voltage source, another one of the second p-type FET drain and the second p-type FET source being coupled to the first node, a third p-type FET having a third p-type FET gate, a third p-type FET drain and a third p-type FET source, the third p-type FET gate being coupled to the third node, one of the third p-type FET drain and the third p-type FET source being coupled to a full internal device voltage source, another one of the third p-type FET drain and the third p-type FET source being coupled to the second node, a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fifth n-type FET drain and the fourth n-type FET source being coupled to ground, and a fifth n-type FET having a fifth n-type FET gate, a FET n-type FET drain and a fifth n-type FET source, the fifth n-type FET gate being coupled to the third node, one of the fifth n-type FET drain and the fifth n-type FET source being coupled to ground, another one of the fifth n-type FET drain and the fifth n-type FET source being coupled to the second node.

20. A low voltage repeater circuit with a latching function implemented on a signal line of an integrated circuit comprising:

an enable node for providing an enable signal;

a low voltage repeater circuit coupled between a first portion of the signal line and a second portion of the signal line, being configured to transmit and latch low voltage signals from the first portion of signal live to the second portion of the signal line when the enable signal is activated, wherein the voltage range associated with the low voltage signals is lower than a full internal device voltage;

a repeater input stage coupled between the first portion of the signal line and the low voltage repeater circuit to pass the low voltage signal from the first portion of the signal line to the low voltage repeater circuit;

a low voltage level shifter circuit, the level shifter circuit being configured to receive the low voltage signal from the repeater input stage and output a higher voltage output signal on the second portion of the signal line, the higher voltage output signal having a voltage range which is higher than the voltage range associated with the low voltage signal, wherein the level shifter circuit comprises, a first p-type FET having a first p-type FET gate, a first p-type FET drain and a first p-type FET source, the first p-type FET gate being coupled to first node, one of the first p-type FET drain and the first p-type FET source being coupled to a full internal device voltage source, another one of the first p-type FET drain and the first p-type FET source being coupled to a third node, the third node being coupled to the second portion of the signal line, and a third n-type FET having a third n-type FET gate, a third n-type FET drain and a third n-type FET source, the third n-type FET gate being coupled to a second node, one of the third n-type FET drain and th third n-type FET source being coupled to the third node, another one of the third n-type FET drain and the third n-type FET source being coupled to ground;

a level shifter input stage coupled between the first portion of the signal line and the level shifter circuit and the latching circuit to pass the low voltage signal from the repeater input stage to the level shifter circuit, wherein the level shifter input stage comprises, a first n-type FET having a first n-type FET gate, a first n-type FET drain and a first n-type FET source, the first n-type FET gate being coupled to a voltage source, the voltage source having a voltage level higher than threshold voltage of the first n-type FET to ensure the first n-type FET is turned on when the level shifter circuit is enabled, one of the first n-type FET drain and the first n-type FET source being coupled to the repeater input stage to receive the low voltage signal passed form the first portion of the signal line, another one of the first n-type FET drain and the first n-type FET source being coupled to the first node, and a second n-type FET having a second n-type FET gate, a second n-type FET drain and a second n-type FET source, the second n-type FET gate being coupled to a voltage source, the voltage source having a voltage level higher than the threshold voltage of the second n-type FET to ensure the second n-type FET is turned on when the level shifter circuit is enabled, one of the second n-type FET drain and the second n-type FET source being coupled to the first portion of the signal line to receive the low voltage signal, another one of the first n-type FET drain and the first n-type FET source being coupled to the second node; and a latching circuit coupled to the level shifter circuit, the latching circuit being configured to latch the low voltage signal from the repeater input stage, wherein the latching circuit comprises, a second p-type FET having a second p-type FET gate, a second p-type FET drain and a second p-type FET source, the second p-type FET gate veing coupled to the third node, one of the second p-type FET drain and the second p-type FET source being coupled to a full internal device voltage source, another one of the second p-type FET drain and the second p-type FET source being coupled to the first node, a fourth n-type FET having a fourth n-type FET gate, a fourth n-type FET drain and a fourth n-type FET source, the fourth n-type FET gate being coupled to the third node, one of the fourth n-type FET drain and the fourth n-type FET source being coupled to the first node, another one of the fourth n-type FET drain and the fourth n-type FET source being coupled to ground, and a fifth n-type FET having a fifth n-type FET gate, fifth n-type FET drain and a fifth n-type FET source, the fifth n-type FET gate being coupled to the third node, one of the fifth n-type FET drain and the fifth n-type FET source being coupled to ground, another one of the fifth n-type FET drain and the fifth n-type FET source being coupled to the second node.

21. A method for implementing a low voltage repeater circuit having a latching function; comprising:

provdiing an input signal at an input terminal of the low voltage repeater circuit, the input terminal being coupled to an input stage of the repeater circuit, the input signal having a first voltage range between first low and first high voltage levels;

latching the input signal;

level shifting the input signal to a second voltage range, the second voltage range between second low and second high voltage levels, the second high voltage level being equal to about a full internal device voltage, the first high voltage level is less than the second high voltage level and full internal device voltage; and the outputting an output signal at an output terminal, the output signal having the first voltage range.

* * * * *

UNITED STATES PATENT AND TRADEMARK OFFICE
CERTIFICATE OF CORRECTION

PATENT NO. : 6,683,486 B2
DATED : January 27, 2004
INVENTOR(S) : Hanson et al.

It is certified that error appears in the above-identified patent and that said Letters Patent is hereby corrected as shown below:

Title page,
Item [73], Assignee, "Infineon Technologies Ag" should read -- Infineon Technologies AG --;

Column 5,
Line 60, "out" should read -- about --;
Line 64, "that" should read -- the --;

Column 6,
Line 11, "retype" should read -- n-type --;
Line 32, "P-type" should read -- p-type --;
Line 46, "th" should read -- third --;
Line 61, "third FET" should read -- third p-type FET --;

Column 7,
Lines 8 and 32, "filth" should read -- fifth --;

Column 9,
Line 34, "receive" should read -- receiving --;
Line 43, "ranges" should read -- range --;
Line 55, "method implementing" should read -- method for implementing --;
Line 61, "than full" should read -- than a full --;

Column 10,
Line 2, remove "," first occurrence.
Line 48, "add" should read -- and --;
Line 49, "to first" should read -- to a first --;

Column 11,
Line 1, "fast" should read -- first --;
Line 61, "forth" should rad -- fourth --;

Column 12,
Line 8, "eater" should read -- repeater --;
Line 21, "circuit the" should read -- circuit, the --;
Line 33, "couples" should read -- coupled --;
Line 56, "insure" should read -- ensure --;

UNITED STATES PATENT AND TRADEMARK OFFICE
CERTIFICATE OF CORRECTION

PATENT NO. : 6,683,486 B2
DATED : January 27, 2004
INVENTOR(S) : Hanson et al.

It is certified that error appears in the above-identified patent and that said Letters Patent is hereby corrected as shown below:

<u>Column 13,</u>
Line 33, "fifth" should read -- fourth --;
Line 51, "live" should read -- line --;

<u>Column 14,</u>
Line 3, "to first" should read -- to a first --;
Line 13, "th" should read -- the --;
Line 25, "then threshold" should read -- than the threshold --;
Line 30, "form" should read -- from --;
Line 52, "veing" should read -- being --;
Line 66, "gate, fifth" should read -- gate, a fifth --; and <u>Column 16,</u>
Line 8, remove "the" first occurrence.

Signed and Sealed this

First Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,683,486 B2
DATED : January 27, 2004
INVENTOR(S) : Hanson et al.

It is certified that error appears in the above-identified patent and that said Letters Patent is hereby corrected as shown below:

<u>Column 9,</u>
Line 51, "coupling the an output node stage to the second the level" should read
-- coupling an output stage to the level --

Signed and Sealed this

Twenty-fourth Day of August, 2004

JON W. DUDAS
*Director of the United States Patent and Trademark Office*